United States Patent
Putinier

(10) Patent No.: US 9,612,294 B2
(45) Date of Patent: Apr. 4, 2017

(54) PROGRAMMABLE SENSORS

(75) Inventor: Rene Putinier, Oak Park, CA (US)

(73) Assignee: SENSATA TECHNOLOGIES, INC., Attleboro, MA (US)

( * ) Notice: Subject to any disclaimer, the term of this patent is extended or adjusted under 35 U.S.C. 154(b) by 364 days.

(21) Appl. No.: 14/381,691

(22) PCT Filed: Feb. 28, 2012

(86) PCT No.: PCT/US2012/026987
§ 371 (c)(1),
(2), (4) Date: Aug. 28, 2014

(87) PCT Pub. No.: WO2013/130050
PCT Pub. Date: Sep. 6, 2013

(65) Prior Publication Data
US 2015/0028865 A1    Jan. 29, 2015

(51) Int. Cl.
*G01R 33/00* (2006.01)
*G01R 33/07* (2006.01)
*G05F 1/563* (2006.01)

(52) U.S. Cl.
CPC ......... *G01R 33/0023* (2013.01); *G01R 33/07* (2013.01); *G05F 1/563* (2013.01)

(58) Field of Classification Search
CPC ....... G05F 1/563; G01R 33/06–33/072; G01R 33/0023; G01R 33/0035; G01R 35/00;
(Continued)

(56) References Cited

U.S. PATENT DOCUMENTS 5,335,186 A * 8/1994 Tarrant ................... G01D 3/022
340/3.3
5,790,046 A * 8/1998 Blossfeld ................. G01D 1/18
307/116

(Continued)

FOREIGN PATENT DOCUMENTS

| CN | 1606825 A | 4/2005 |
| CN | 101644612 A | 2/2010 |
| EP | 2136402 A1 | 12/2009 |

OTHER PUBLICATIONS

Microchip Technology Inc. (2002). 3-Pin Microcontroller Reset Monitors TCM809/TCM810 [datasheet]. Retrieved from http://www.datasheets360.com/pdf/3123708391733299022.
(Continued)

*Primary Examiner* — Huy Q Phan
*Assistant Examiner* — David Frederiksen
(74) *Attorney, Agent, or Firm* — Hunter Clark PLLC

(57) ABSTRACT

Disclosed are methods, systems, devices, sensors, and other implementations, including a programmable sensor system that includes a variable voltage source ("VVS") to receive an external input voltage and provide a variable output voltage from the input voltage, the VVS configured to be controlled to adjust behavior of the VVS, and a programmable sensor coupled to an output of the VVS to receive the variable output voltage. The sensor is configured to be programmed when a programming voltage of at least a predetermined level is provided by the VVS to power the sensor, and to perform regular sensor operations when regular-operation voltage is provided by the VVS to power the sensor. The sensor system further includes a controller to cause controllable adjustment of the VVS to provide the
(Continued)

programming voltage for a predetermined period of time to power the sensor so as to cause the sensor to be programmed.

18 Claims, 6 Drawing Sheets

(58) Field of Classification Search
CPC ...... G01R 35/005; G11C 17/02; G11C 17/14; G11C 17/16; G11C 17/165; G11C 16/00; G11C 16/02; G11C 16/04; G11C 16/10; G01D 1/18
See application file for complete search history.

(56) References Cited

U.S. PATENT DOCUMENTS

| | | | |
|---|---|---|---|
| 5,790,469 A | 8/1998 | Wong | |
| 6,351,116 B1* | 2/2002 | Bolda | G01R 35/005 324/202 |
| 6,404,174 B1 | 6/2002 | Boudreaux, Jr. et al. | |
| 6,421,757 B1 | 7/2002 | Wang et al. | |
| 6,528,988 B2 | 3/2003 | Bolda et al. | |
| 6,570,373 B1* | 5/2003 | Viola | G01R 35/005 324/117 H |
| 6,664,900 B1* | 12/2003 | Motz | G01D 18/00 327/58 |
| 7,423,858 B2 | 9/2008 | Dobbs et al. | |
| 8,054,124 B2 | 11/2011 | Wirth | |
| 2003/0111988 A1 | 6/2003 | Sundaram et al. | |
| 2006/0119334 A1* | 6/2006 | Kilian | G05F 3/30 323/282 |
| 2009/0315550 A1 | 12/2009 | De Rosa et al. | |

OTHER PUBLICATIONS

Micrel Inc. (Feb. 2010). 150mA Low-Dropout Voltage Regulator MIC2950*/2951 [datasheet]. Retrieved from http://www.micrel.com/_PDF/mic2950.pdf.
Melexis. (Apr. 2011). Rotary Position Sensor IC MLX90316 [datasheet]. Retrieved from http://www.melexis.com/Asset/MLX90316-DataSheet-old-1457-DownloadLink-4834.aspx.
Microchip Technology Inc. (2012). Voltage Supervisor MCP13X/2X 19 [datasheet]. Retrieved from http://ww1.microchip.com/downloads/en/DeviceDoc/21985D.pdf9.html.
Maxim Integrated. (Aug. 2012). Precision High-Voltage Reference in SOT23 MAX6043 [datasheet]. Retrieved from http://datasheets.maximintegrated.com/en/ds/MAX6043.pdf.
International Search Report & Written Opinion of the International Search Authority (KR) dated Mar. 4, 2013, for International Application No. PCT/US2012/026987, 9 pgs.
International Preliminary Report on Patentability for International Application No. PCT/US2012/026987, dated Sep. 12, 2014, 8 pgs.
Micronas. (Feb. 2, 2000). Programmable Linear Hall Effect Sensor HAL805 [datasheet], 26 pgs.
Infineon Technologies AG. (Jan. 2007). Programmable Linear Hall Sensor TLE4998S4 [datasheet], 34 pgs.
State Intellectual Property Office of the P.R.C. (SIPO) Search Report for Application No. 201280072726.5 dated May 26, 2015, 1 pg.
Extended European Search Report (Supplementary European Search Report & European Search Opinion) dated May 28, 2015 for European Application No. EP12869843, 8 pgs.
State Intellectual Property Office of the P.R.C.(SIPO) First Office Action for Application No. 201280072726.5 dated Jun. 3, 2015, 2 pgs.
State Intellectual Property Office of the P.R.C. (SIPO) Notice of Allowance for Application No. 201280072726.5 dated Jan. 18, 2016, 4 pgs.

* cited by examiner

PROGRAMMABLE SENSORS

BACKGROUND

Some procedures and techniques for programming devices such as programmable sensors, enable device programming by controlling the power delivered to such devices. For example, in some implementations, programming signaling waveforms are provided on the devices' power lines to program such programmable devices, or programming signals may be provided through dedicated data ports. In some implementations, increasing the power voltage delivered to the programmable devices causes those devices to enter programming mode and to enable programming signals, whether delivered through the power lines or through another port (e.g., through a bi-directional input/output port) to program the programmable devices.

When voltage regulators are used with such programmable devices (for example, in situations where the devices have been installed and have been setup for their intended applications, and are thus coupled to their associated voltage regulators), the regulators may block the programming signals (because the regulators may eliminate all spurious signals from the input and provide smooth power). Furthermore, the voltage regulators may be configured to output some pre-determined maximum voltage, and may, therefore, fail to provide the programmable device with the higher power level generally required to cause the programmable device to enter its programmable mode.

SUMMARY

Disclosed herein are systems, devices, sensors, methods and other implementations including a system that includes a variable voltage source (e.g., regulator) coupled with, for example, a controller with timer functionality. Such a controller can alter the source's output voltage behavior (e.g., how it processes/converts input voltage from an external power supply) for a predetermined amount of time to allow programming signals to pass through the regulator to a programmable sensor, such as a Hall effect sensor. After a timeout period, the variable voltage source may revert back to its normal output behavior.

The variable voltage source may be any device, or combination of devices, that allow for output of two or more different output voltages controlled by selection from an external device.

In some embodiments, the variable voltage source may be a low drop-out voltage regulator to enable external voltages lower than the programmed output voltage to pass through the regulator with very little drop. A "drop out" voltage of a source/regulator is defined, under some circumstances, as the difference between a regulator's input and output values when the input is at its lowest level for which the output is still in regulation, e.g., a 5V regulator that has a 0.5V "drop out" will still maintain a 5V output with any voltage at or above 5.5V; if it's less than 5.5V, it will no longer regulate to 5V. In some implementations, voltage regulators with a higher drop-out voltage may be used. Under such circumstances, it may become necessary for the external programmer to increase the voltage levels to accommodate the drop from the regulator. For example, for a low drop regulator that has a drop out of only 0.3 V and a programmable device with programming voltage of approximately 7.8V, the voltage that needs to be provided to the source may be 8.1V (7.8V+0.3V). If the variable voltage source has a drop out voltage of about 1.7V, then the voltage provided for such a variable voltage source may be 9.5V (7.8V+1.7V). The idea is to set the voltage (also referred to as "programmer's voltage") so that after it passes through the source/regulator, the particular programmable device in the example will still see a voltage of 7.8V. Alternatively, in some embodiments, a secondary circuit between the regulator and the sensor, to raise the voltage levels to an appropriate level, may be used.

In some embodiments, the Hall effect sensor could be any device, or combination of devices, that senses position of a magnet to achieve determination of an angle of an externally moved member. In some embodiments, other types of programmable sensors and/or programmable devices may be used.

Thus, in some embodiments, a programmable sensor system is disclosed. The system includes a variable voltage source to receive an external input voltage and provide a variable output voltage from the received external input voltage, the variable voltage source configured to be controlled to adjust behavior of the variable voltage source, and a programmable sensor coupled to an output of the variable voltage source to receive the variable output voltage. The programmable sensor is configured to be programmed when a programming voltage, provided by the variable voltage source from the external input voltage, of at least a predetermined level is provided through the output of the variable voltage source to power the programmable sensor, and to perform regular sensor operations when regular-operation voltage, provided by the variable voltage source from the external input voltage, is provided through the output of the variable voltage source to power the programmable sensor. The programmable sensor system further includes a controller to cause controllable adjustment of the variable voltage source to provide the programming voltage for a predetermined period of time to power the programmable sensor so as to cause the programmable sensor to be programmed.

Embodiments of the system may include at least some of the features described in the present disclosure, including one or more of the following features.

The programmable sensor may include a programmable Hall effect sensor that includes a power input line coupled to the output of the variable voltage source, the power input line configured to receive electrical power to power the programmable Hall effect sensor. The Hall effect sensor may be configured to receive programming signals to program the programmable Hall effect sensor during application of the programming voltage.

The programmable Hall effect sensor may be configured to be programmed when the programming voltage applied to the power input line of the programmable Hall effect sensor is at a first level of at least 7.0 V, and the programmable Hall effect sensor may also be configured to perform regular sensor operation when the regular-operation voltage applied to the power input line of the programmable Hall effect sensor is at a second level of less than 7.0 V.

The variable voltage source may include a variable voltage regulator associated with an adjustable maximum allowed output voltage, the variable voltage regulator electrically coupled to an adjustment circuit controlling the maximum allowed voltage. The controller may include a reset controller coupled to the adjustment circuit, the reset controller configured to, in response to a voltage change of the external input voltage to a reset voltage, modify the adjustment circuit so as to modify the maximum allowed output voltage to cause the output of the variable voltage regulator to be adjusted to provide the programming voltage.

The adjustment circuit may include one or more of, for example, a voltage divider circuit, and/or a switching circuit including one or more switching devices.

The programmable sensor system may further include a calibration system to control the external input voltage provided to the variable voltage source, and transmit programming signals to program the programmable sensor.

The calibration system may include an external power supply, and the calibration system configured to control the external input voltage may be configured to control the external power supply.

The calibration system configured to control the external input voltage may be configured to lower the external input voltage to a reset voltage to cause the controller to adjust the variable voltage source to adjust the variable voltage source's maximum allowed output voltage to enable the programming voltage to be outputted to the programmable sensor.

The calibration system configured to control the external input voltage may be further configured to increase the external input voltage, after the external input voltage was lowered to the reset voltage, to cause the variable voltage source to provide the programming voltage through the output of the variable voltage source.

The controller configured to cause controllable adjustment of the variable voltage source may be configured to detect occurrence of at least one of a predefined power condition and a predefined timing condition, and in response to the detection of the occurrence of the at least one of the predefined power condition and the predefined timing condition, cause the variable voltage source to provide the programming voltage for the predetermined period of time to power the programmable sensor. The controller may further be configured to cause the variable voltage source to provide the regular-operation voltage upon completion of the predetermined period of time.

In some embodiments, a method is disclosed. The method includes adjusting a variable voltage source with a variable output voltage to output a programming voltage of at least a predetermined voltage level, applying the adjusted programming voltage, provided by the variable voltage source from an external input voltage, for a predetermined period of time to power a programmable sensor, and programming the programmable sensor during application of the adjusted programming voltage to power the programmable sensor, the programmable sensor is configured to perform regular sensor operations when a regular-operation voltage, provided by the variable voltage source from the external input voltage, is applied to power the programmable sensor.

Embodiments of the method may include at least some of the features described in the present disclosure, including at least some of the features described above in relation to the programmable sensor system, as well as one or more of the following features.

Programming the programmable sensor may include programming a programmable Hall effect sensor when the programming voltage applied to the power input line of the programmable Hall effect sensor is at a level of at least 7.0 V.

The variable voltage source may include a variable voltage regulator associated with an adjustable maximum allowed output voltage, the variable voltage regulator electrically coupled to an adjustment circuit controlling the maximum allowed output voltage, and the method may further include, in response to a voltage change of the external input voltage to a reset voltage, modifying the adjustment circuit so as to modify the maximum allowed output voltage to cause the variable voltage regulator to provide the programming voltage to the programmable sensor.

The method may further include controlling, by a calibration system, the external input voltage provided to the variable voltage source, and transmitting, by the calibration system, programming signals to program the programmable sensor.

Controlling the external input voltage may include lowering the external input voltage to a reset voltage to cause a controller to adjust the variable voltage source to adjust the variable voltage source's maximum allowed output voltage to enable the programming voltage to be outputted to the programmable sensor.

The calibration system may include an external power supply, and controlling the external input voltage may include controlling the external power supply.

Adjusting the variable voltage source may include detecting occurrence of at least one of a predefined power condition and a predefined timing condition, and in response to the detection of the occurrence of the at least one of the predefined power condition and the predefined timing condition, causing the variable voltage source to provide the programming voltage for the predetermined period of time to power the programmable sensor. Adjusting the variable voltage source may further include causing the variable voltage source to provide the regular-operation voltage upon completion of the predetermined period of time.

In some embodiments, a programmable sensor system is disclosed. The programmable sensor system includes a variable voltage source to receive an external input voltage and provide a variable output voltage from the received external input voltage, the variable voltage source configured to be controlled to adjust behavior of the variable voltage source, and a programmable sensor coupled to an output of the variable voltage source to receive the variable output voltage. The programmable sensor is configured to be programmed when a programming voltage, provided by the variable voltage source from the external input voltage, of at least a predetermined level is provided through the output of the variable voltage source to power the sensor, and to perform regular sensor operations when regular-operation voltage, provided by the variable voltage source from the external input voltage, is provided through the output of the variable voltage source to power the programmable sensor. The programmable sensor system further includes a controller to detect occurrence of at least one of a predefined power condition and a predefined timing condition, in response to the detection of the occurrence of the at least one of the predefined power condition and the predefined timing condition, cause the variable voltage source to provide the programming voltage for a predetermined period of time to power the programmable sensor, and cause the variable voltage source to provide the regular-operation voltage upon completion of the predetermined period of time.

Embodiments of the programmable sensor system may include at least some of the features described in the present disclosure, including at least some of the features described above in relation to the first programmable sensor system and the method.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, is meant to encompass variations of ±20% or ±10%, ±5%, or +0.1% from the specified value, as such variations are appropriate to in the context of the systems, devices, sensors, circuits, methods, and other implementations described herein.

As used herein, including in the claims, "and" as used in a list of items prefaced by "at least one of" or "one or more of" indicates that any combination of the listed items may be used. For example, a list of "at least one of A, B, and C" includes any of the combinations A or B or C or AB or AC or BC and/or ABC (i.e., A and B and C). Furthermore, to the extent more than one occurrence or use of the items A, B, or C is possible, multiple uses of A, B, and/or C may form part of the contemplated combinations. For example, a list of "at least one of A, B, and C" may also include AA, AAB, AAA, BB, etc.

Other and further objects, features, aspects, and advantages of the present disclosure will become better understood with the following detailed description of the accompanying drawings.

BRIEF DESCRIPTION OF THE DRAWINGS

Like reference symbols in the various drawings indicate like elements.

DETAILED DESCRIPTION

Disclosed herein are systems, devices, sensors, methods, and other implementations, including a programmable sensor system that includes a variable voltage source (e.g., a variable voltage regulator) to receive an external input voltage and provide a variable output voltage, the variable voltage source configured to be controlled to adjust behavior of the variable voltage source. For example, in implementations in which a variable voltage regulator is used, the maximum output voltage allowed at the regulator's output may be adjusted to increase or decrease that maximum allowed voltage. The programmable sensor system further includes a programmable sensor, such as a Hall effect sensor, coupled to an output of the variable voltage source to receive the variable output voltage. The programmable sensor is configured to be programmed when a programming voltage, provided/produced by the variable voltage source from the external input voltage, of at least a predetermined level (e.g., 7.0 V or any other appropriate level which be higher or lower than 7.0 V) is provided through the output of the variable voltage source to power the sensor, and to perform regular sensor operations when regular-operation voltage (e.g., less than 7.0 V, or less than some other appropriate level), also produced/provided by the variable voltage source from the external input voltage, is provided through the output of the variable voltage source to power the programmable sensor. Also included in the programmable sensor system is a controller to cause controllable adjustment of the variable voltage source (e.g., to change its maximum allowed voltage level) to provide the programming voltage to power the programmable sensor so as to cause the programmable sensor to be programmed.

Sensors, such as Hall Effect sensors, can be used in various control applications where high accuracy outputs are needed in cost effective sealed packages. To achieve high sensor accuracy, the sensor is often built and installed into the application that uses it (e.g., a sealed bag) and then calibrated after assembly and installation. By calibrating after assembly and installation, at least some of the effects of mechanical stack-up and tolerances can be programmed out of the device. However, after installation, the sensor is typically coupled to a voltage source configured to generally supply voltage required for normal sensor operations. Sensors such as those described herein can be put into programming mode by powering the sensor with a voltage level that is different from the voltage level used during normal sensor operations, e.g., applying voltage that is higher than that used during normal operations. Therefore, to enable sensor programming for sensors already installed into their intended applications, a mechanism to controllably enable such post-installation sensor programming/calibration is implemented.

Figure 1:
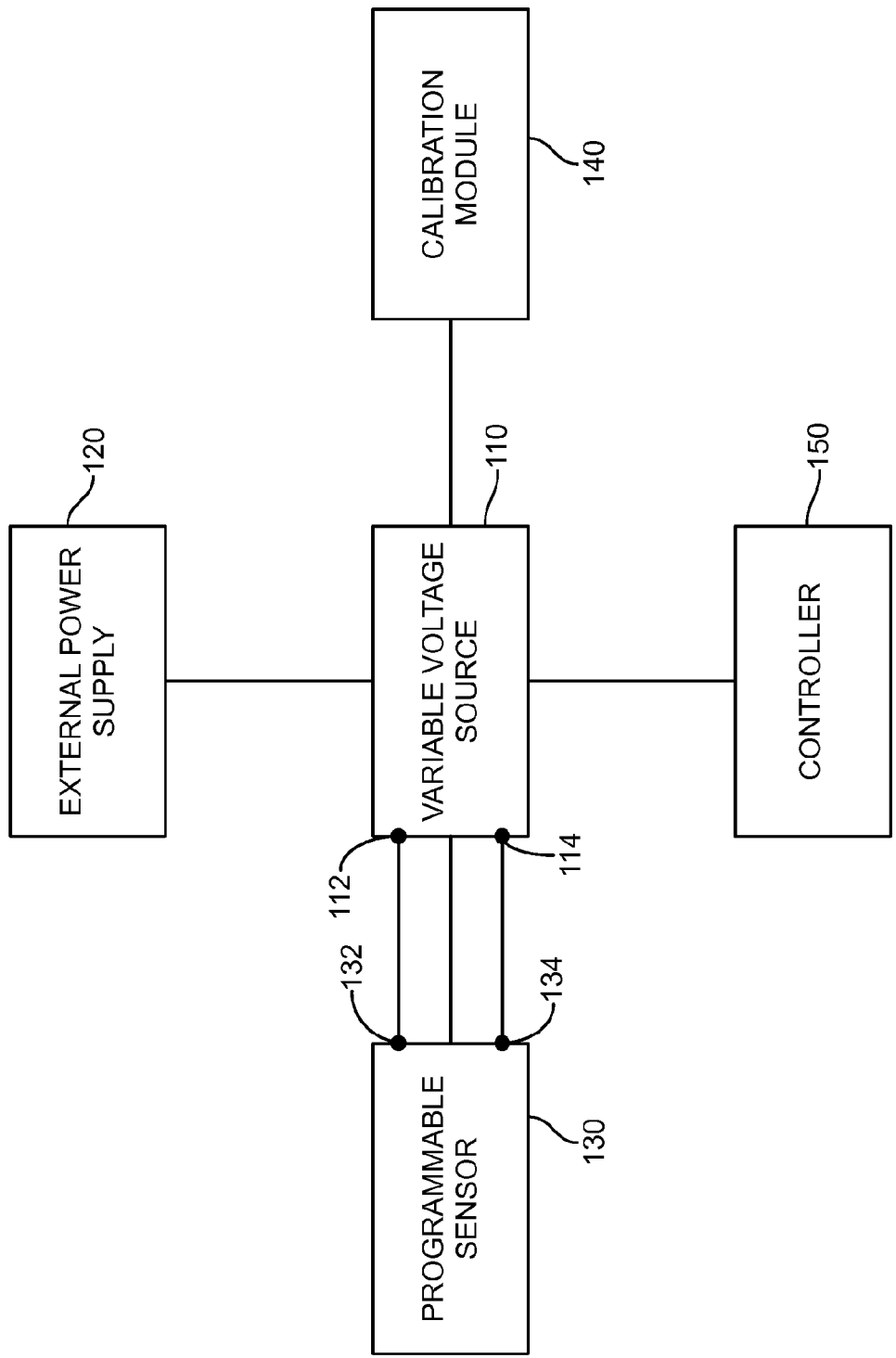
FIG. 1 is a schematic diagram of a programmable sensor system.

Thus, with reference to FIG. 1, a schematic diagram of a programmable sensor system 100 to enable programming of a programmable device, such as a programmable sensor, coupled to a variable voltage source, is shown. The system 100 includes a variable voltage source 110 that is configured to receive an external input electrical voltage from an external supply 120, and to provide a variable output voltage produced from the external input voltage. The variable voltage source is configured to be controlled to adjust its behavior. In some implementations, the variable voltage source may be a variable voltage regulator that limits a controllable maximum allowed output voltage that can be provided. For example, if the maximum voltage of such a variable voltage regulator is set/adjusted to 5.0 V, the variable voltage regulator would generally output no more than the maximum voltage level of 5.0 for any input voltage (from the external voltage supply) exceeding this maximum value (taking into account any drop-out voltage resulting from the use of the voltage source, as described above). On the other hand, in some embodiments, the variable voltage regulator may provide a voltage approximate to the external input voltage (less any drop-out voltage) to the regulator when that input voltage is below the set maximum of the regulator. As will become apparent below, because, in some embodiments, the voltage level required to program a sensor of the system 100 is generally higher than the maximum voltage level used during normal operations of the voltage source and/or the sensor, when it becomes necessary to program or re-program the sensor once normal operations have begun (e.g., in situations where the sensor needs to be re-calibrated), the maximum voltage of the variable voltage source needs to be adjusted to a higher value or else the lower maximum voltage level used for normal operations of the regulator (and/or the system 100) would prevent the programming voltage from being outputted by the variable voltage source. The variable voltage source 110 may be implemented based on different voltage regulation technologies and configurations, including, for example, electronic voltage regulators (with or without a feedback configuration) such as buck and boost-type regulators, electromechanical voltage regulators, active regulators (including active linear regulators, switching regulators, etc.), AC and DC voltage stabilizers, voltage dividers, etc.

Coupled to the output of the variable voltage source 110 is a programmable sensor 130 configured to be programmed when a programming voltage of at least a predetermined level (e.g., 7.0 V, 10.0 V, 20.0 V, 40.0 V, or higher than 40.0V) is provided through the output of the variable voltage source to power the sensor. When the sensor is to perform regular/normal sensing operations, the programmable sensor is provided with a voltage from the output of the variable voltage source 110 (produced from the external input voltage inputted to the variable voltage source) that is different than the voltage level used to program the sensor. For example, in some implementations, the "normal operations" voltage (i.e., the voltage applied to power the sensor while the sensor performs sensing/measurements and measurement processing operations) may be lower than the programming voltage, and, therefore, during normal operation the behavior of variable voltage source needs to be controlled/adjusted so that the output provided by the variable voltage source is substantially at the level(s) required for normal operations of the sensor 130. As shown in FIG. 1, the programmable sensor 130 may include a power input 132 that is electrically coupleable to the output 112 of the variable voltage source 110 and can receive through that input electrical voltage to power the sensor. As noted, the sensor can be powered with at least two different voltage levels, with one level (e.g., the lower level, which may be less than 7.0V) causing the sensor to operate in normal mode and preventing programming functionality during the time that the normal-operation voltage level is applied at the sensor's input 132. The sensor 130 further includes a programming input/port electrically coupled to an output port 114 through which programming signals (e.g., data and control signals) may be sent to the sensor to enable programming of the sensor 130. Such programming signal may be retrieved from a storage unit of the variable voltage source and/or may be transmitted from another device, such as a calibration/programmer system/module 140, that communicates these programming signals. Other source devices configured to communicate programming signals to the programmable sensor 130 may be used in addition to or in place of the calibration system 140 and/or the variable voltage source 110, including, for example, various remote devices such a wireless device, a remote computing device, etc. In some embodiments, programming signals may be transmitted on the power line via the power input port 132. For example, the programming voltage waveform may be modulated using the programming signals (e.g., based on such modulation techniques as, for example, pulse width modulation). Alternatively and/or additionally, the programming signals may be added to the programming voltage waveform and communicated on the line connecting ports 112 and 132.

In some embodiments, the programmable sensor may be a programmable Hall effect sensor configured, for example, to sense or measure magnetic fields (e.g., by measuring magnetic flux density), with such measurements used, for example, to determine angular positioning of a rotating structure (such as a magnet disposed proximate the sensor), perform proximity switching, perform positioning operation, perform speed detection, perform current sensing, etc. In some implementations, integrated-circuit-based programmable Hall effect sensors may be used, such as, for example, the MLX90316 rotary position sensor manufactured by Melexis™. Further details regarding the MLX90316 sensor are provided, for example, in the April, 2011 MLX90316 Datasheet, published by Melexis™, the content of which is hereby incorporated by reference in its entirety. Briefly, a typical three wire Hall effect device like the MLX90316 may use power, ground and output signal, may be integrated into a package that has a three pin connector for these signals. During normal operations, the device operates from, for example, a +5V supply, although in some embodiments, power supplies providing a power voltage of, for example, less than 7.0 V may be used. During normal operations, the sensing element of the sensor (e.g., the upper surface of an integrated circuit implementation of the Hall effect sensor) senses magnetic flux density, e.g., generated by a moving magnet positioned above the sensing surface, that results in corresponding output signals, such as corresponding voltages, that are representative of the sensed magnetic flux density. A processor, such as a micro-controller and/or a DSP processor, coupled to the sensing element, is configured to process the output signals of the sensing element to generate a resultant signals or values (e.g., angular position of the structure causing the magnetic flux) that is outputted by the controller, e.g., via the port output 134 of the sensor 130 depicted in FIG. 1). In some embodiments, the processor (not shown) may be disposed in the same housing of the sensing element, or may be situated outside such a housing.

During calibration, voltage supply produced from the external power supply and provided by the voltage source 110 to the sensor may be raised, for example, to a level of at least 7.0 V, e.g., a level of 7.8 V. The higher voltage level may be provided by controlling the output voltage provided by the variable voltage source 110 and/or by controlling the voltage applied by the external power supply 120 to the variable voltage source 110. Control of the voltages outputted by the external power supply 120 and/or the variable voltage source 110 may be effected using the calibration system 140. The higher voltage causes the Hall effect sensor to enter a calibration/programming mode through which data/content on internal EEPROM cells, or other storage device or media coupled to the sensor, are altered by sending data into the device. In some embodiments, programming data may be sent via a bidirectional output pin, e.g., the port 134 of the sensor 130 shown in FIG. 1, used to provide measurement results of the Hall effect sensor. In some embodiments, the programming signals may be communicated on the power line. For example, as noted, the power waveform may be modulated to include the programming signals thereon, or the programming signals may be added as another component (in addition to the power voltage waveform) delivered on the power line feeding into the programmable device. In some embodiments, programming signals may be communicated to the programmable sensor via a bidirectional output pin of the programmable sensor, with the voltage/power line of the programmable device used for particular voltage signaling (e.g., to cause the programmable device to enter programming mode). In the example of a Hall effect sensor, the sensor may be programmed/calibrated to, for example, adjust the output voltage offset, gain and clamping (in situations where the output voltage is provided as an analog signal), define the transfer the transfer function relating a computed angle (determined based on the signals resulting from the sensed flux density) and an output voltage value (analog and/or digital), and to generally define the programmable performance and functionality of the sensor (e.g., control DSP filter parameters).

As noted, other types of Hall effect sensors may be used in addition to or instead of the example Hall effect sensor described herein. Also, additional sensor types (e.g., programmable sensors), other than the programmable Hall effect sensors described herein, and other types of programmable devices, may also be used.

With continued reference to FIG. 1, the programmable sensor system 100 further includes a controller 150 configured to cause controllable adjustment of the variable voltage source to enable programming voltage to be provided for a predetermined period of time, e.g., 200 ms, or any appropriate duration required for programming/calibrating the sensor so as to cause the programmable sensor to be programmed. In some embodiments, the controller configured to cause controllable adjustment of the variable voltage source is configured to detect occurrence of at least one of a predefined power condition (e.g., a voltage drop below some predetermined voltage threshold to cause a trip of the controller) and/or a predefined timing condition (e.g., causing the variable voltage source to output a programming voltage at some predefined interval, such as every hour, every day, every week, etc., or causing the variable voltage source to output a programming voltage at predetermined specific time instances). In such embodiments, the controller is further configured to, in response to the detection of the occurrence of the at least one of, for example, the predefined power condition and/or the predefined timing condition, cause the variable voltage source to provide the programming voltage for the predetermined period of time to power the programmable sensor, and to cause the variable voltage source to provide the regular-operations voltage upon completion of the predetermined period of time.

As shown in FIG. 1, in some embodiments, the controller 150 may be electrically coupled to the variable voltage source to cause it to output programming voltage (i.e., the output voltage to power the sensor provided at a level that will cause the sensor to enter programming/calibration mode). In some embodiments, the controller configured to cause the controllable adjustment of the voltage source's voltage may include specially-developed controller, and/or may include controllers such as a the reset controller MCP1319 (also referred to as a "voltage supervisor"), manufactured by Microchip™ Technology Inc. For example, in some implementations, a controller such as the MCP1319 may be configured to force a reset pin to an active or inactive state once the voltage on the device rises above, or falls below, a predetermined trip voltage. The controller includes a timer that keeps the reset pin active or inactive for a predetermined period of time, before reversing the state of the reset pin (e.g., if the reset pin became active as a result of the trip, the reset pin will become inactive at the end of the predetermined time period, as timed by the controller's timer). Further details regarding the MCP1319 controller are provided, for example, in the MCP1319 datasheet published by Microchip Technology Inc., the content of which is hereby incorporated by reference in its entirety.

In some embodiments, other types of reset timers for control of the variable voltage source may be used, and may include any device or combination of devices configured to sample an input voltage and to provide an output to the variable voltage source (or to a circuit coupled thereto) for a set amount of time. Additionally, the time duration during which the controller causes the variable voltage source to adjust its output voltage to enable programming of the programmable device (e.g., programmable sensor) may be any time interval (e.g., longer or shorter than 200 ms) required to allow programming of the programmable device. In some embodiments, the controller (which may include a voltage-detecting circuit) may be placed on the input side of the variable voltage source or on the output side of the variable voltage source (in the embodiments of FIGS. 2 and 4, discussed in greater details below, the reset controller is shown to be placed on the output side of the variable voltage source). When placed on the input side of the variable voltage source, additional circuitry may be required to be used in conjunction with the controller so as to enable the controller to perform controllable adjustment of the variable voltage source to enable programming voltage to be provided to the sensor for a predetermined period of time.

As noted, the programmable sensor system 100 also includes the calibration system/module 140 configured to control the external input voltage provided to the variable voltage source and to transmit programming signals to program the programmable sensor. In some embodiments, the calibration module (also referred to as a programmer system/module) may include an external voltage supply that is controller through a controller (e.g., processor-based controller) implemented in the calibration module 140. In such embodiments, a separate external power supply, such as the external power supply 120 of FIG. 1, is not required. The calibration module may control and initiate post-installation programming of the programmable sensor 130 coupled to the variable voltage source 110 by causing an initial drop in the voltage level of the external input voltage. Such a drop in voltage causes the output voltage of the variable voltage source to drop to a level below the predetermined voltage trip level of the controller 150. The output voltage of the variable voltage source is coupled to an input voltage port of the reset controller (as well as to the input voltage port of the programmable sensor), and because the output voltage of the variable voltage source has dropped below the voltage trip level of the controller, the controller trips. As will be described in further details below, once tripped, the controller causes adjustment of the behavior of the variable voltage source (e.g., changing its maximum allowed voltage) to enable higher voltages (than those previously outputted) to be outputted by the variable voltage source. In addition, the controller's trip may also start a timer.

With the variable voltage source 110 having been adjusted to enable higher voltage levels to be outputted, the calibration module 140 can control the external power supply 120 to provide a voltage level sufficient to cause the sensor to enter its programming mode (as noted, in some embodiments, the power supply may be part of the calibration system 140). Because the voltage behavior of the variable source 110 has been adjusted to enable voltages higher than those that were previously outputted (i.e., before the controller was tripped), the programmable sensor 130, now receiving a higher voltage from the variable voltage source, can enter programming mode.

With the programmable sensor 130 in programming mode, the calibration module 140 is configured to send programming/calibration signals to program/calibrate the sensor 130. The sensor 130 is configured to remain in programming mode so long that the received input voltage level used to power it is at a level that causes it to be in programming mode. To terminate the programming voltage provided to the sensor, upon the completion of the timer period (e.g., after 200 ms), as timed by the controller 150, the controller 150 causes the variable voltage source to adjust its output voltage to a level that is insufficient to keep the sensor in programming mode. In some embodiments, the variable voltage source can be controlled to change its behavior prior to completion of the timer period. Thus, the controller causes the variable voltage source to output a voltage used for normal sensor operations. As a result, the sensor returns to its normal operation mode and resumes its measurement operations (e.g., to measure magnetic flux density, in implementations including a programmable Hall effect sensor) and/or to perform processing operations based on its new programmed/calibration configuration. It is to be noted that the calibration module 140 may be coupled directly to the programmable sensor when the programmable sensor is initially programmed prior to its installation and coupling to the variable voltage source.

Figure 2:
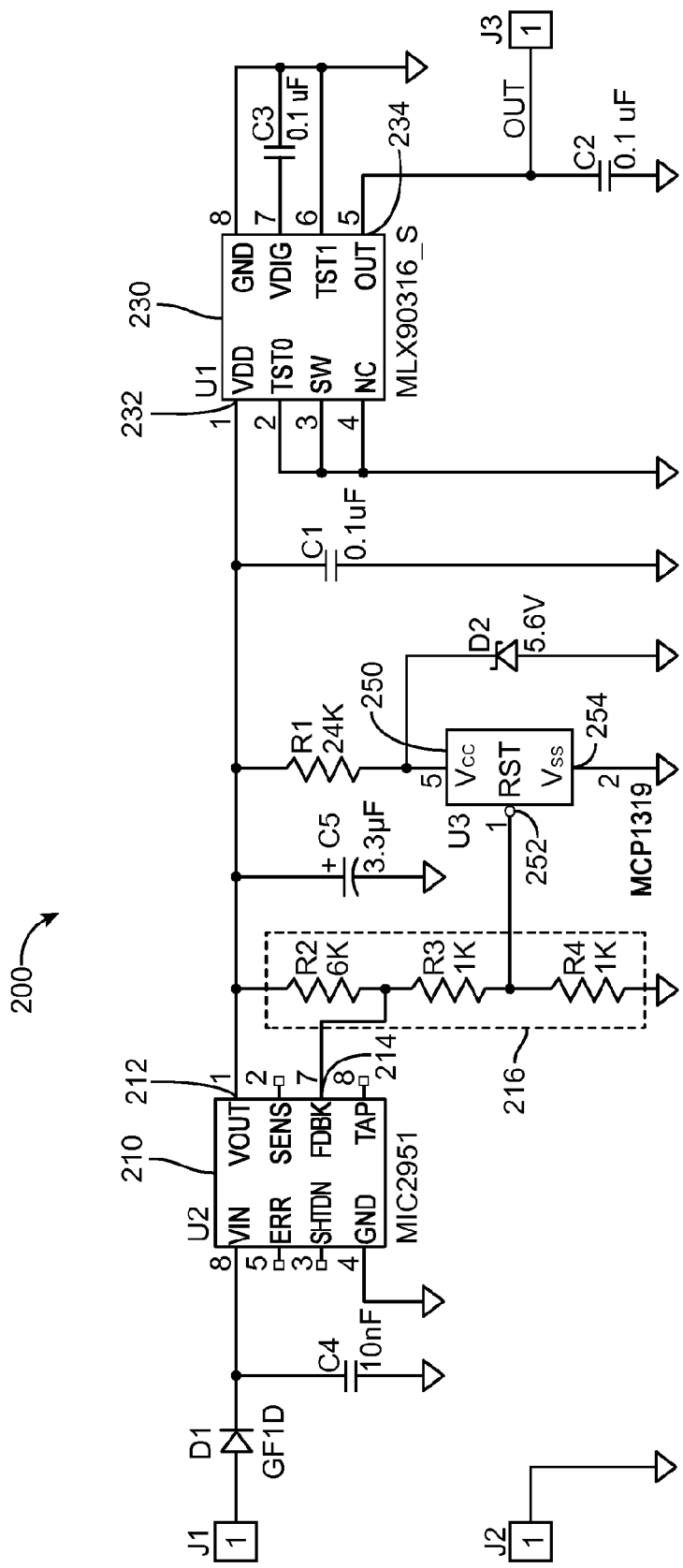
FIG. 2 is a circuit diagram of an example programmable sensor system.

Operation of programmable sensor systems may further be illustrated with reference to FIG. 2, showing a circuit diagram of another example programmable sensor system 200. The sensor system 200 may have a similar general configuration to that depicted in relation to the system 100 of FIG. 1. The system 200 includes a variable voltage source 210 which, like the variable voltage source 110 of FIG. 1, is configured to receive an external input electrical voltage (from an external voltage supply similar to the voltage supply 120 of FIG. 1) and to provide a variable output voltage (produced from the external input voltage), and is further configured to be controlled to adjust its behavior. As shown in FIG. 2, in some implementations, the variable voltage source 210 may be a variable voltage regulator with a programmable maximum output voltage that can be controlled through an adjustment circuit 216 (e.g., a voltage divider circuit) tied to the regulator's feedback (FDBK) pin 214. Thus, by controlling the configuration of the adjustment circuit 216, the maximum allowed voltage that can be outputted by the regulator 210 can be adjustably/programmably controlled. In some implementations, the voltage regulator may be a specially-implemented regulator for the system 200, or may be a voltage regulator such as the MIC2951, manufactured by Micrel Inc. Further details regarding the MIC2951 voltage regulator are provided, for example, in the MIC2951 datasheet published by Micrel Inc., the content of which is hereby incorporated by reference in its entirety.

As further shown in FIG. 2, also electrically coupled to the adjustment circuit 216 is a controller 250, which may be similar to the controller 150 of FIG. 1, and may include the MCP1319 reset controller. In some embodiments, the controller may be configured to modify the adjustment circuit, in response to a voltage change at its input resulting from a voltage change of the external input voltage to another voltage level (also referred to as a "reset voltage," which may be lower than the present voltage provided by the external power supply) so as to modify the maximum allowable voltage of the regulator 210.

The system 200 also includes a programmable sensor 230 whose voltage input port 232 (through which electrical power is received to power the sensor) is electrically coupled to the output 212 of the variable voltage source 210. In the example embodiments of FIG. 2, the programmable sensor 230 may be a Hall effect sensor implemented using an MLX90316 sensor similar to the sensor 130 described in relation to FIG. 1. As with the sensor 130 of the system 100, during normal operations the sensor 230 is powered with a voltage level of, for example, less than 7.0 V (e.g., a voltage level of about 5.0 V). To program the sensor 230 via the already installed variable voltage source 210, the output voltage of the source 210 needs to be raised to a programming voltage level (e.g., of at least 7.0 V) to thus cause the sensor 230 to enter its programming mode. Accordingly, to raise the output voltage of the variable voltage regulator 210 beyond its present maximum voltage (which may have been set to a level of approximately 5.0 V), the programmable maximum voltage of the regulator 210 has to be adjusted.

In the example embodiments of FIG. 2, the maximum allowable output voltage of the regulator 210 is determined based on the configuration of the voltage divider circuit 216. During normal operations, the reset controller 250 is configured so that its input impedance at its reset (RST) pin 252 is very high (effectively resulting in an open electrical path between the pin 252 and pin 254 of the controller 250 that is connected to ground). With this configuration, the approximate maximum output voltage of the regulator can be determined according to the relationship:

$$V_{out} \approx V_{ref} \times \left\{1 + \frac{R2}{R3 + R4}\right\}$$

where $V_{ref}$ is a reference voltage with a value of approximately 1.25 V. In the example embodiment of FIG. 2, with R2 equaling to 6 KΩ and R3 and R4 each equaling 1 KΩ, the approximate maximum voltage of the regulator 210 can be computed to be $V_{out} \approx 1.25V \times (1+6/2) = 5V$ When the reset controller 250 detects a voltage drop below a predetermined trip voltage level (e.g., 4.0-4.8 V), the reset controller 250 will be tripped and, in the example embodiments of FIG. 2, the electrical path between the pin 252 and the pin 254 of the controller 250 will be closed, causing the pin 252 to be grounded. As a result, R4 of the circuit divider 216 will also be grounded, and, accordingly, the programmable approximate maximum allowed voltage of the variable voltage regulator 210 would be determined according to the relationship of:

$$V_{out} \approx V_{ref} \times \left\{1 + \frac{R2}{R3}\right\}$$

In the example embodiment of FIG. 2, with R2 equaling to 6 KΩ and R3 equaling 1 KΩ, the approximate maximum voltage of the regulator 210, when the reset controller modifies the configuration of the voltage divider circuit 216 by grounding the resistor R4, can be computed to be $V_{out} \approx 1.25V \times (1+6/1) = 8.75V$ (in practice the relationship governing the value of the maximum $V_{out}$ is also dependent on the term $I_{FB}R2$, where $I_{FB}$ is the feedback pin bias current, which is generally small, causing the actual maximum $V_{out}$ voltage to be slightly less than the 8.75 V value computed when R4 is grounded).

In some embodiments, to cause the controller 250 to trip, a control module, such as the calibration system 140 of the sensor system 100 of FIG. 1 may cause the external input voltage to provide input voltage lower than the trip voltage of the controller 250. This lower input voltage received at the variable voltage regulator 210 results in a lower regulator output voltage, which causes the reset controller 250, coupled to the output port 212 of the regulator 210, to trip and to thus ground R4. Tripping the reset controller also starts a timer (not shown) included with (e.g., is part of) the controller 250.

As a result of tripping the controller 250, the maximum output voltage of the variable voltage regulator is adjusted to its higher maximum allowed voltage (in accordance with the configuration of the divider circuit 216). The regulator 210 will thus be able to output voltages higher than its previous maximum allowed voltage.

After adjustment of the maximum allowed voltage that can be outputted by the regulator 210, the calibration module (or some other controller to control the sensor programming operations) causes the external power supply to provide a voltage at a level sufficient to enable sensor programming. This programming voltage level is outputted by the regulator and causes the programmable sensor 230 to enter programming mode. The calibration module can now send programming signals to the sensor 230 to program/calibrate the sensor.

When the timer of the reset controller 250 reaches its predetermined reset period (e.g., 200 ms), the electrical path between pin 252 and 254 of the controller 250 will be opened, and R4 will no longer be grounded. As a result, the previous maximum allowable regulator voltage of approximately 5.0 V will be restored, thus inhibiting any further sensor programming. Although the sensor will generally not be operational while it is being programmed during the predetermined period (e.g., 200 ms), this is usually not an issue for most applications. Once normal operation voltage has been restored and is provided by the output of the regulator 210 to the input port 232 of the sensor, normal sensor operations can resume.

Figure 3:
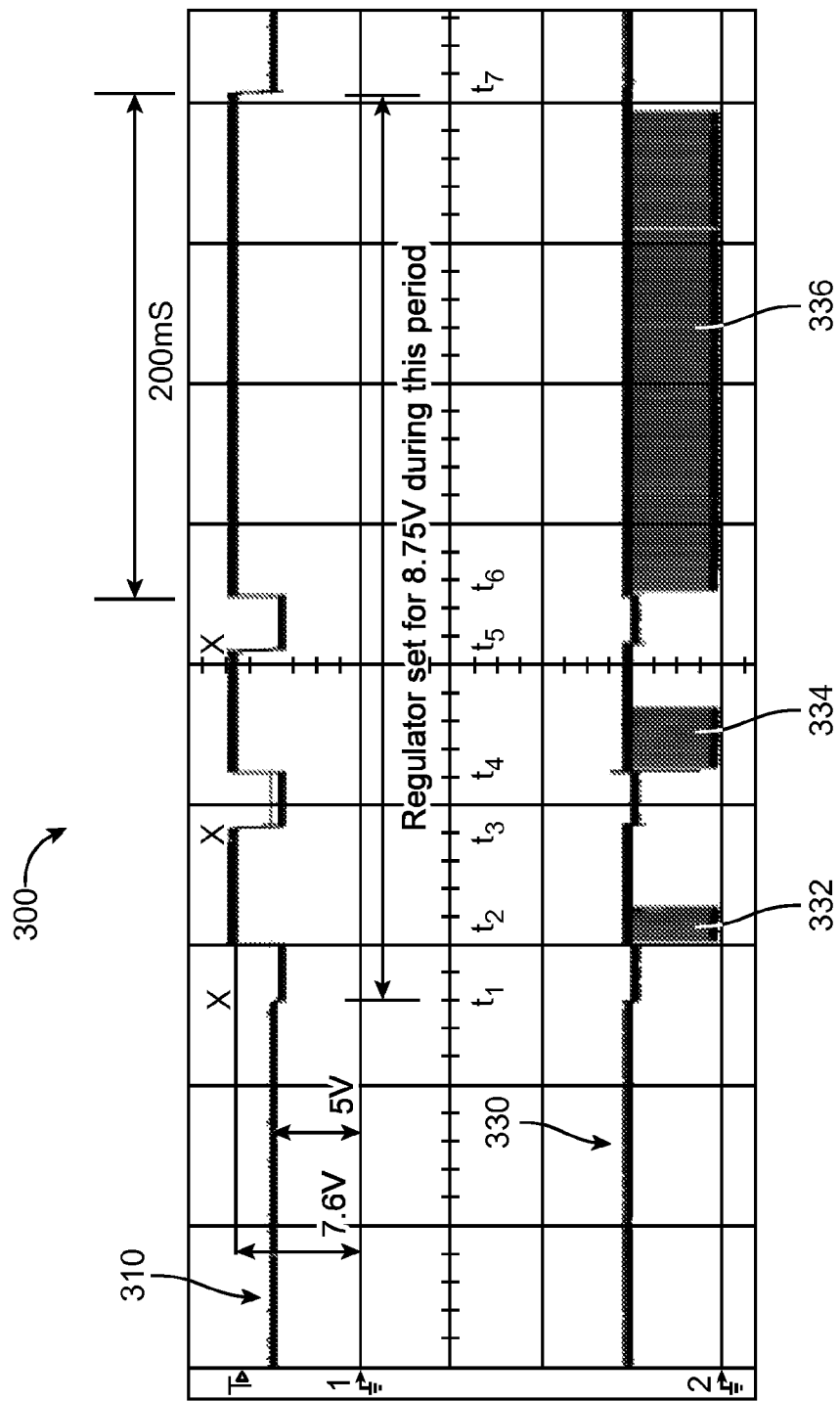
FIG. 3 is a timing diagram showing a voltage waveforms applied to a programmable sensor, and a programming signal waveform applied to the programmable sensor.

FIG. 3 is a timing diagram 300 showing a voltage waveforms 310 applied to a programmable sensor, such as the sensor 230 of FIG. 2, via the $V_{DD}$ pin 1 of the sensor, and a programming signal waveform 330 that is applied to the sensor via, for example, the OUT pin 234 (marked as pin 5) of the sensor 230. As noted, in some implementations, the programming signal waveform 330 may be applied via the $V_{DD}$ pin 232, e.g., by modulating the power voltage waveform, or by adding the programming signals to the power voltage waveform. The timing diagram corresponds to operations performed, for example, on a programmable sensor system such as the system 200 of FIG. 2. During normal sensor operations, the sensor receives a normal operation voltage of, in some embodiments, 5.0 V (even if the input voltage to the regulator is at a higher level of, for example, 7.8V, in which case the regulator will cause its output voltage, while the controller is active and has not been tripped, to the normal operation voltage of, for example, 5.0 V). To enable programming of the sensor, a higher programming voltage needs to be provided to the sensor to power it, and accordingly, a variable voltage regulator (such as the regulator 210 of FIG. 2) needs to have its output voltage adjusted so that it can output voltage levels to enable programming of the sensor. Therefore, at $t_1$, a calibration system (or some other controlling hardware) causes a change in the external voltage provided to voltage regulator (be it from an external voltage supply or from a supply directly coupled to the calibration system). For example, the calibration system may cause a regular external voltage of 7.8-8.0 V (which the regulator will regulate to the present maximum allowed voltage of 5.0 V) to drop to, for example, 5.0 V. In this example, the regulator may have a drop-out voltage of approximately 0.2 V, and thus, for an input voltage of 5.0 V, the regulator's output voltage would be 4.8 V. This small output voltage decrease causes a reset controller coupled to an adjustment circuit (e.g., implemented as a voltage divider) to trip. As a result, the configuration of the voltage divider circuit is modified, causing the maximum allowed regulator's output voltage to be set to higher voltage (e.g., 8.75 V, in the example of FIG. 3).

With the regulator's maximum allowed voltage adjusted to 8.75 V, the calibration/programmer system may cause the external input voltage to be, at $t_2$ (which may occur at a period of, for example, 20 ms after $t_1$) higher than the previous maximum allowed voltage, and to cause the sensor to enter programming mode. Thus, in the example of FIG. 3, the external input voltage is approximately 7.8-8.0 V, and a similar voltage level (less any drop-out voltage attributed to the regulator) is outputted by the voltage regulator (e.g., 7.6-7.8V when the drop-out voltage is 0.2 V) and provided to the sensor, which in turn causes the sensor to enter programming mode. With the sensor now in programming mode, the calibration module can send the programming signals 332. It is to be noted that in implementations where the regulator has a drop-out of only 0.2V, the sensor can be programmed without having to modify the calibration system's standard output voltage level. Because the sensor effectively does not distinguish between 7.8V and 7.6V, the sensor will still enters the programming mode with a calibration system that can also be used to program sensors without a regulator separating the sensor and the calibration system (e.g., in situations where the sensor is undergoing its initial programming/calibration). On the other hand, in implementations where the dropout of the reference is relatively large (e.g., about 1.7V in the circuit of FIG. 4 discussed below), the sensor may not be able to enter programming mode with a normally configured calibration system (it would need to be set to output a higher voltage to compensate for the large drop-out at the regulator).

In some embodiments, to ensure that the sensor will remain in programming mode, the calibration module may cause the reset controller to be tripped again (i.e., even before the reset controller's timer has reached its programmed predetermined period), so that the variable voltage regulator's maximum allowed voltage remains at, in this example, 8.75 V. Thus, at $t_3$, the calibration module trips again the reset controller by causing the regulator output voltage to drop to a value of approximately 4.5-4.75 V, and once the controller is re-tripped at $t_3$, the calibration module controls the external power supply to cause, at $t_4$, the variable voltage regulator's output voltage to be approximately 7.6 V-7.8 V. With the regulator's output voltage at a level sufficient to enable continued programming of the programmable sensor, another programming transmission signal 334 is provided to the programmable sensor.

At $t_5$ the calibration system once again re-trips the reset controller (by controlling the external power supply to provide input voltage that would result in a regulator's output voltage low enough to trip the reset controller) to cause the regulator's maximum allowed voltage to remain at approximately 8.75 V. At $t_6$, after the regulator's output voltage is again increased to 7.6 V-7.8 V, the calibration module sends programming signals 336 to the programmable sensor.

In the example of FIG. 3, there are no further programming signals that need to be provided to the programmable sensor. Therefore, once the reset controller's timer reaches the predetermined timed period (200 ms in this example) from the last instance that the reset controller detected a tripping voltage (i.e., a period of 200 ms from time instance $t_6$), the reset controller causes, at $t_7$, modification of the adjustment circuit that controls the maximum allowed voltage of the variable voltage regulator, to adjust the maximum allowed voltage to its original value (e.g., of approximately 5.0 V). Subsequently, voltages outputted by the regulator will enable normal sensor operations.

Figure 4:
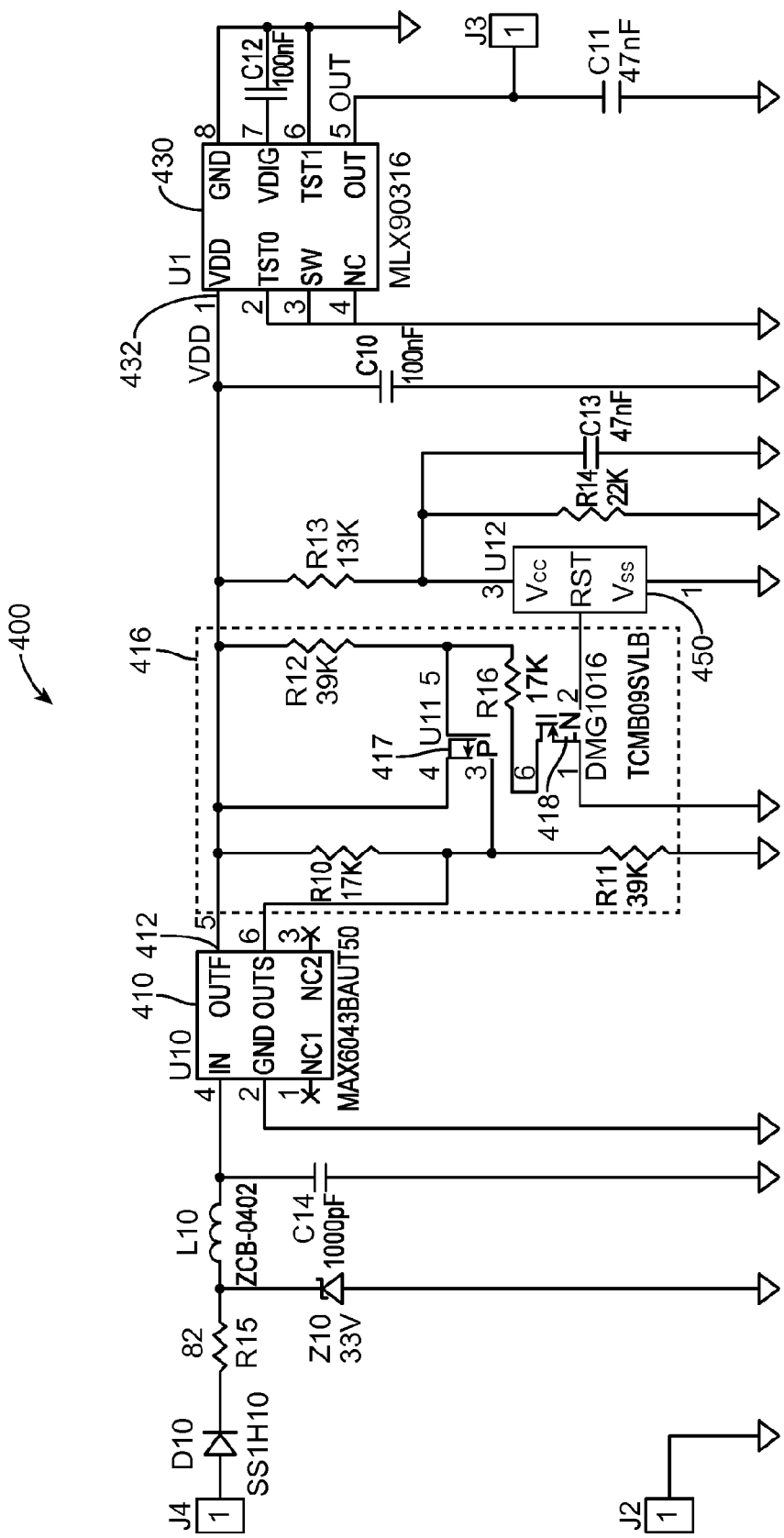
FIG. 4 is a circuit diagram of another example programmable sensor system.

Another example of a programmable sensor system is provided in FIG. 4, showing a circuit diagram of a programmable sensor system 400. The sensor system 400 may have a similar general configuration to that depicted in relation to the systems 100 and 200 of FIGS. 1 and 2, respectively. The system 400 includes a variable voltage source 410 to receive an external input voltage and provide a variable output voltage, produced from the external input voltage, and is further configured to be controlled to adjust its behavior. The variable voltage source 410 of FIG. 4 may be a variable voltage regulator with a programmable maximum output voltage that can be controlled through an adjustment circuit coupled to an input port/pin of the regulator. In the example embodiments of FIG. 4, the variable voltage regulator may be an MAX6043 precision high voltage reference device, manufactured by Maxim Integrated Products, Inc. Further details regarding the MAX6043 voltage regulator are provided, for example, in the MAX6043 datasheet published by Maxim, the content of which is hereby incorporated by reference in its entirety. The MAX6043 voltage regulator is configured to provide accurate preset reference voltages from up to +40V input voltages. The reference voltages may be controlled via an adjustment circuit 416, whose electrical configuration can be controlled through a controller 450. In the embodiments of FIG. 4, the adjustment circuit is implemented as a switching circuit that includes one or more switching components (such as transistors). A change to the electrical configuration to the adjustment circuit will alter the electrical behavior of the circuit, and, as a result, will cause a change to the regulator's reference voltage. As further shown in FIG. 4, coupled to the voltage IN pin 4 of the regulator 410 is an over-voltage circuit including a diode D10, a resistor R15, and a zener diode Z10. The zener diode Z10 will clamp incoming voltage to a particular voltage level, e.g., 33.0 V, and the diode D10 is configured to block negative voltages. Also coupled to the IN pin of the regulator is a filter circuit, formed from inductor L10, and capacitor C14, to reduce noise entering the system.

The adjustment circuit 416 is also electrically coupled to the controller 450, which like controllers 150 and 250 of FIGS. 1 and 2, is configured to cause controllable adjustment of the variable voltage regulator to enable providing a programming voltage for a predetermined period of time to power a programmable sensor so as to cause the programmable sensor to be programmed. In the example system 400 of FIG. 4, the controller 450 may include the TCM809SVLB reset controller manufactured by Microchip. Further details regarding the TCM809SVLB voltage regulator are provided, for example, in the TCM809SVLB datasheet published by Microchip, the content of which is hereby incorporated by reference in its entirety. In some embodiments, the controller may be configured to modify the adjustment circuit 416, in response to a voltage change of the external input voltage to another voltage level (also referred to as a "reset voltage" or "reset threshold," which may be lower than the present voltage provided by the external power supply), so as to modify the output voltage reference of the regulator 410.

The system 400 also includes a programmable sensor 430 whose voltage input port 432 (through which electrical power is received to power the sensor) is electrically coupled to output 412 of the variable voltage regulator 410. In the example embodiments of FIG. 4, the programmable sensor 430 may be a Hall effect sensor implemented using, for example, an MLX90316 sensor similar to the sensors 130 and 230 described in relation to FIGS. 1 and 2, respectively. During normal operation, the sensor 430 is powered with a voltage level of, for example, less than 7.0 V, or some other appropriate value (e.g., a voltage level of 5.0 V). To program the sensor 430, the output voltage of the regulator needs to be raised to a programming voltage level (e.g., at least 7.0 V, or some other appropriate level which may be lower or higher than 7.0 V) to thus cause the sensor 430 to enter its programming mode.

To enable programming of the sensor 430, the output voltage of the variable voltage regulator 410 needs to be lowered to a level that would cause the controller 450 to trip. In some embodiments, the controller 450 has a reset threshold (i.e., detection voltage) of 2.93 V. R13 and R14 form a voltage divider that keeps the controller 450's supply at about 3.14V when the output voltage is approximately 5.0 V. Thus, when the output voltage of the regulator 410 drops to 4.66V, the controller's input voltage drops to 2.93 and triggers the controller. Similar to the embodiments of the system 200 of FIG. 2, in some implementations, the regulator's output voltage can be lowered (to thus cause a controller's trip) using a calibration system that controls an external power supply to cause it to lower the voltage supplied to the regulator to a level that is lower than the regulator's pre-set 5.0 V reference voltage.

The adjustment circuit 416 include a dual FET circuit with a P-channel FET transistor 417, and an N-channel FET transistor 418. Prior to the triggering of the controller 450, the dual FET circuit shorts out the resistor R10 for normal 5V operation (the pin OUTS of the regulator 410 is shorted to the pin OUTF). When the controller 450 is triggered (e.g., its output goes low), the N-channel FET transistor 418 is turned off, which allows the gate of the P-channel FET transistor 417 to rise and also be turned off. As a result, the resistor R10 becomes unshorted and the output of the output voltage is set at about 8.0 V.

Once the reference voltage of the regulator (i.e., the maximum allowed voltage that can be outputted by the regulator) has been controllably adjusted to enable voltage level for programming the programmable sensor 430, operations to program the sensor can be performed in a manner similar to that described in relation to FIGS. 1, 2, and 3.

Figure 5:
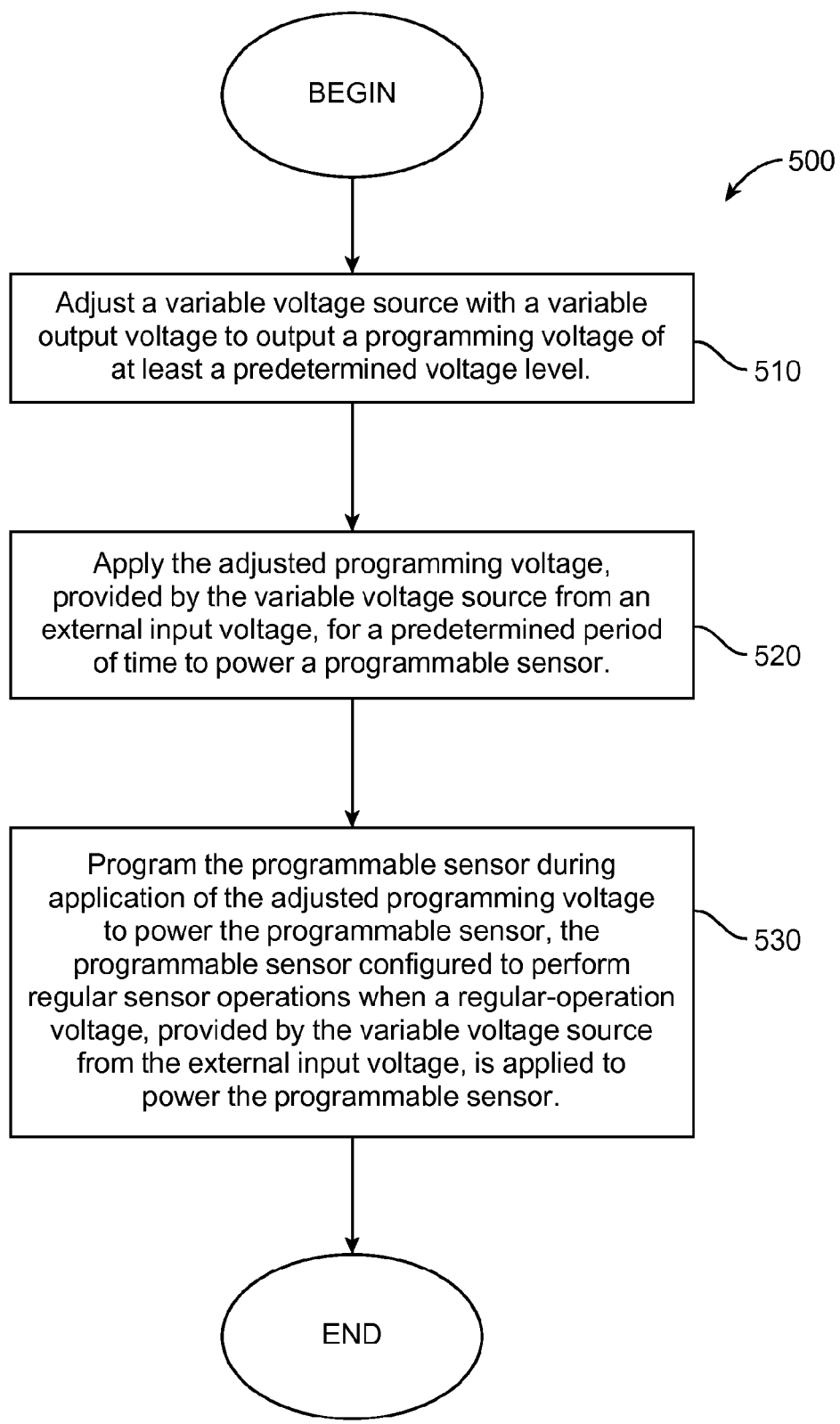
FIG. 5 is a flow chart of a procedure to program a programmable sensor.

With reference to FIG. 5, a flow chart of a procedure 500 to program a programmable sensor is shown. The procedure 500 may be implemented, at least in part, using the apparatus shown in one or more of FIGS. 1, 2, and/or 4. The procedure 500 includes adjusting 510 a variable voltage source, e.g., a variable voltage regulator such as those described in relation to FIGS. 2 and 4, with a variable output voltage to output a programming voltage of at least a predetermined voltage level (e.g., output a programming voltage of 7.8 V, or any other appropriate level, that causes a programmable sensor to enter programming mode). Adjusting the output voltage of the variable voltage regulator may be performed, for example, by using a controller (such as the controllers 250 and/or 450 described in relation to FIGS. 2 and 4, respectively) that can be controlled to modify the configuration of an adjustment circuit coupled to a pin of the variable voltage regulator. Controlling the controller that modifies the configuration of the adjustment circuit may be performed using a calibration system/module, or such similar hardware, to cause, for example, a change in the voltage applied to the controller so that the controller is tripped when enough of a voltage change has been detected (e.g., if the voltage drops below some voltage threshold). In some embodiments, the adjustment to the variable voltage regulator is such that a reference voltage, corresponding to the maximum allowed voltage of the regulator, is varied. This enables the regulator to output a higher voltage than what would have been allowed prior to the adjustment of the regulator's reference voltage.

Having adjusted the variable voltage regulator so that programming voltage to enable programming the sensor is outputted by the regulator, the programming voltage, provided by the variable voltage source from the external input voltage, is applied 520 for a predetermined period of time to power the programmable sensor. The programming voltage applied to the programmable sensor (e.g., a Hall effect sensor such as the sensors 130, 230, and/or 430 described in relation to FIGS. 1, 2, and 4, respectively) causes the programmable sensor to enter programming mode.

The programmable sensor is programmed 530 during application of the programming voltage to power the programmable sensor. Programming signals may be provided by the calibration module, or by some other device, which may be internal or remote to the programmable sensor. The programming signals may be provided through, for example, the sensor's output port (such a port may be bi-directional), through the input voltage port, or through some other dedicated port or pin. Once the programming voltage has been de-asserted, e.g., after a timer of the controller causes the controller to modify the adjustment circuit to its original configuration that results in restoring the normal-operations reference voltage of the variable voltage regulator, the programmable sensor is configured to resume performing regular sensor operations when a regular-operation voltage is applied to its input power port.

Figure 6:
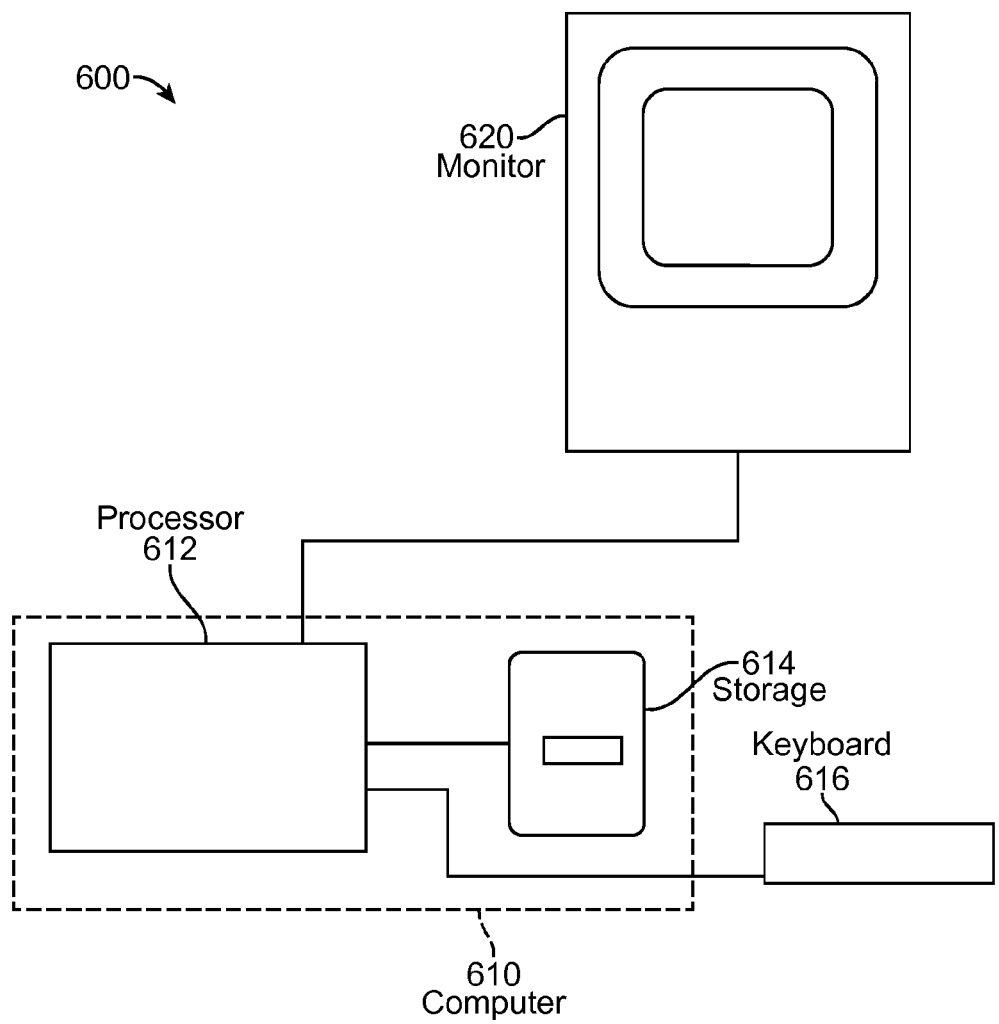
FIG. 6 is a schematic diagram of a generic computing/processing system.

The various devices, units, modules described herein, including, for example, the calibration system, the programmable sensor, etc., may be implemented, at least in part, using a processor-based device. With reference to FIG. 6, a schematic diagram of a generic computing/processing system/device 600 is shown. The computing system 600 includes a processor-based device 610 such as a personal computer, a specialized computing device, and so forth, that typically includes a central processor unit 612. In addition to the CPU 612, the system may include a main memory, cache memory and bus interface circuits (not shown). The processor-based device 610 may include a mass storage element 614, such as a hard drive and/or a flash drive associated with the system. The system 600 may include, in some embodiments requiring direct user interaction, a keyboard, or keypad, 616, and a monitor 620, e.g., a CRT (cathode ray tube) or LCD (liquid crystal display) monitor, that may be placed where a user can access them.

The processor-based device(s) 610 is configured to facilitate, for example, the implementation of the programmable sensor programming procedures, including adjusting the voltages provided by a variable voltage regulator to a programmable sensor to enable its programming, causing a controller coupled to the regulator to be tripped to enable the adjustment of the regulator's output voltage, etc. The storage device 614 may include a computer program product that when executed on the processor-based device 610 causes the processor-based device to perform operations to facilitate the implementation of the above-described procedures. The processor-based device may further include peripheral devices to enable input/output functionality. Such peripheral devices may include, for example, a CD-ROM drive and/or flash drive, a network connection (implemented using, for example, a USB port, a wireless transceiver, etc.), for downloading related content to the connected system. Such peripheral devices may also be used for downloading software containing computer instructions to enable general operation of the respective system/device. Alternatively and/or additionally, in some embodiments, special purpose logic circuitry, e.g., an FPGA (field programmable gate array), a DSP processor (as in the case of, for example, some of the programmable sensors described herein), or an ASIC (application-specific integrated circuit) may be used in the implementation of the system 600. Other modules that may be included with at least some of the various device, modules, and machines described herein are speakers, a sound card, a pointing device, e.g., a mouse or a trackball, by which the user can provide input to the computing system 600. The processor-based device 610 may include an operating system.

Computer programs (also known as programs, software, software applications or code) include machine instructions for a programmable processor, and may be implemented in a high-level procedural and/or object-oriented programming language, and/or in assembly/machine language. As used herein, the term "machine-readable medium" refers to any non-transitory computer program product, apparatus and/or device (e.g., magnetic discs, optical disks, memory, EPROMS, Programmable Logic Devices (PLDs)) used to provide machine instructions and/or data to a programmable processor, including a non-transitory machine-readable medium that receives machine instructions as a machine-readable signal.

While particular embodiments have been disclosed herein in detail, this has been done by way of example for purposes of illustration only, and is not intended to be limiting with respect to the scope of the appended claims, which follow. In particular, it is contemplated that various substitutions, alterations, and modifications may be made without departing from the spirit and scope of the invention as defined by the claims. Other aspects, advantages, and modifications are considered to be within the scope of the following claims. The claims presented are representative of the embodiments and features disclosed herein. Other unclaimed embodiments and features are also contemplated. Accordingly, other embodiments are within the scope of the following claims.

What is claimed is:

1. A programmable sensor system comprising:
    a variable voltage source to receive an external input voltage and provide a variable output voltage from the received external input voltage, the variable voltage source configured to be controlled to adjust behavior of the variable voltage source;
    a programmable sensor coupled to an output of the variable voltage source to receive the variable output voltage, the programmable sensor configured to be programmed when a programming voltage, provided by the variable voltage source from the external input voltage, of at least a predetermined level is provided through the output of the variable voltage source to power the programmable sensor, and to perform regular sensor operations when regular-operation voltage, provided by the variable voltage source from the external input voltage, is provided through the output of the variable voltage source to power the programmable sensor; and
    a controller to cause controllable adjustment of the variable voltage source, the controller configured to:
        detect occurrence of at least one of a predefined power condition and a predefined timing condition;
        in response to the detection of the occurrence of the at least one of the predefined power condition and the predefined timing condition, cause the variable voltage source to provide the programming voltage for a predetermined period of time to power the programmable sensor; and
        cause the variable voltage source to provide the regular-operation voltage upon completion of the predetermined period of time.

2. The programmable sensor system of claim 1, wherein the programmable sensor comprises a programmable Hall effect sensor comprising:

a power input line coupled to the output of the variable voltage source, the power input line configured to receive electrical power to power the programmable Hall effect sensor;

wherein the programmable Hall effect sensor is configured to receive programming signals to program the programmable Hall effect sensor during application of the programming voltage.

3. The programmable sensor system of claim 2, wherein the programmable Hall effect sensor is configured to be programmed when the programming voltage applied to the power input line of the programmable Hall effect sensor is at a first level of at least 7.0 V, and wherein the programmable Hall effect sensor is configured to perform regular sensor operation when the regular-operation voltage applied to the power input line of the programmable Hall effect sensor is at a second level of less than 7.0 V.

4. The programmable sensor system of claim 1, wherein the variable voltage source includes a variable voltage regulator associated with an adjustable maximum allowed output voltage, the variable voltage regulator electrically coupled to an adjustment circuit controlling the maximum allowed output voltage;

and wherein the controller includes a reset controller coupled to the adjustment circuit, the reset controller configured to:
in response to a voltage change of the external input voltage to a reset voltage, modify the adjustment circuit so as to modify the maximum allowed output voltage to cause the output of the variable voltage regulator to be adjusted to provide the programming voltage.

5. The programmable sensor system of claim 4, wherein the adjustment circuit includes one or more of: a voltage divider circuit, and a switching circuit including one or more switching devices.

6. The programmable sensor system of claim 1, further comprising:
a calibration system to:
control the external input voltage provided to the variable voltage source; and
transmit programming signals to program the programmable sensor.

7. The programmable sensor system of claim 6, wherein the calibration system comprises an external power supply, and wherein the calibration system configured to control the external input voltage is configured to:
control the external power supply.

8. The programmable sensor system of claim 6, wherein the calibration system configured to control the external input voltage is configured to:
lower the external input voltage to a reset voltage to cause the controller to adjust the variable voltage source to adjust the variable voltage source's maximum allowed output voltage to enable the programming voltage to be outputted to the programmable sensor.

9. The programmable sensor system of claim 8, wherein the calibration system configured to control the external input voltage is further configured to:
increase the external input voltage, after the external input voltage was lowered to the reset voltage, to cause the variable voltage source to provide the programming voltage through the output of the variable voltage source.

10. A method for programming a programmable sensor, the method comprising:

adjusting a variable voltage source with a variable output voltage to output a programming voltage of at least a predetermined voltage level;

applying the adjusted programming voltage, provided by the variable voltage source from an external input voltage, for a predetermined period of time to power the programmable sensor; and programming the programmable sensor during application of the adjusted programming voltage to power the programmable sensor, the programmable sensor configured to perform regular sensor operations when a regular-operation voltage, provided by the variable voltage source from the external input voltage, is applied to power the programmable sensor;

wherein adjusting the variable voltage source comprises:
detecting occurrence of at least one of a predefined power condition and a predefined timing condition;
in response to the detection of the occurrence of the at least one of the predefined power condition and the predefined timing condition, causing the variable voltage source to provide the programming voltage for the predetermined period of time to power the programmable sensor; and
causing the variable voltage source to provide the regular-operation voltage upon completion of the predetermined period of time.

11. The method of claim 10, wherein the programmable sensor comprises a programmable Hall effect sensor comprising:
a power input line coupled to an output of the variable voltage source, the power input line configured to receive electrical power to power the programmable Hall effect sensor;
wherein the programmable Hall effect sensor is configured to receive programing signals to program the programmable Hall effect sensor during application of the programming voltage.

12. The method of claim 11, wherein programming the programmable sensor comprises:
programming the programmable Hall effect sensor when the programming voltage applied to the power input line of the programmable Hall effect sensor is at a level of at least 7.0 V.

13. The method of claim 10, wherein the variable voltage source includes a variable voltage regulator associated with an adjustable maximum allowed output voltage, the variable voltage regulator electrically coupled to an adjustment circuit controlling the maximum allowed output voltage, and wherein the method further comprises:
in response to a voltage change of the external input voltage to a reset voltage, modifying the adjustment circuit so as to modify the maximum allowed output voltage to cause the variable voltage regulator to provide the programming voltage to the programmable sensor.

14. The method of claim 13, wherein the adjustment circuit includes one or more of: a voltage divider circuit, and a switching circuit including one or more switching devices.

15. The method of claim 10, further comprising:
controlling, by a calibration system, the external input voltage provided to the variable voltage source; and
transmitting, by the calibration system, programming signals to program the programmable sensor.

16. The method of claim 15, wherein controlling the external input voltage comprises:
lowering the external input voltage to a reset voltage to cause a controller to adjust the variable voltage source to adjust the variable voltage source's maximum allowed output voltage to enable the programming voltage to be outputted to the programmable sensor.

17. The method of claim 15, wherein the calibration system comprises an external power supply, and wherein controlling the external input voltage comprises:
controlling the external power supply.

18. A programmable sensor system comprising:
a variable voltage source to receive an external input voltage and provide a variable output voltage from the received external input voltage, the variable voltage source configured to be controlled to adjust behavior of the variable voltage source;
a programmable sensor coupled to an output of the variable voltage source to receive the variable output voltage, the programmable sensor configured to be programmed when a programming voltage, provided by the variable voltage source from the external input voltage, of at least a predetermined level is provided through the output of the variable voltage source to power the sensor, and to perform regular sensor operations when regular-operation voltage, provided by the variable voltage source from the external input voltage, is provided through the output of the variable voltage source to power the programmable sensor; and
a controller to:
detect occurrence of at least one of a predefined power condition and a predefined timing condition;
in response to the detection of the occurrence of the at least one of the predefined power condition and the predefined timing condition, cause the variable voltage source to provide the programming voltage for a predetermined period of time to power the programmable sensor; and
cause the variable voltage source to provide the regular-operation voltage upon completion of the predetermined period of time.

* * * * *